United States Patent
Suh

(10) Patent No.: US 8,524,530 B2
(45) Date of Patent: Sep. 3, 2013

(54) FLEXIBLE SEMICONDUCTOR PACKAGE AND METHOD FOR FABRICATING THE SAME

(75) Inventor: Min Suk Suh, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 13/323,061

(22) Filed: Dec. 12, 2011

(65) Prior Publication Data

US 2012/0083074 A1    Apr. 5, 2012

Related U.S. Application Data

(62) Division of application No. 12/432,973, filed on Apr. 30, 2009, now Pat. No. 8,097,933.

(30) Foreign Application Priority Data

Oct. 8, 2008 (KR) .......................... 10-2008-0098753

(51) Int. Cl.
*H01L 23/495* (2006.01)
(52) U.S. Cl.
USPC ............ 438/106; 438/109; 438/107; 438/108
(58) Field of Classification Search
USPC .................................... 438/108, 109; 29/840
See application file for complete search history.

(56) References Cited

U.S. PATENT DOCUMENTS

| | | | |
|---|---|---|---|
| 6,208,525 B1 | 3/2001 | Imasu et al. | |
| 6,528,877 B2 * | 3/2003 | Ernst et al. | 257/707 |
| 6,553,660 B2 * | 4/2003 | Nakamura | 29/840 |
| 2005/0285246 A1 | 12/2005 | Haba et al. | |
| 2008/0087995 A1 * | 4/2008 | Yang et al. | 257/676 |
| 2008/0237840 A1 * | 10/2008 | Alcoe et al. | 257/706 |

FOREIGN PATENT DOCUMENTS

| | | |
|---|---|---|
| JP | 2008-504689 T | 2/2008 |
| KR | 10-0687000 B1 | 2/2007 |

OTHER PUBLICATIONS

USPTO RR mailed Dec. 22, 2010 in connection with U.S. Appl. No. 12/432,973.
USPTO NFOA mailed Mar. 24, 2011 in connection with U.S. Appl. No. 12/432,973.
USPTO NOA mailed Sep. 28, 2011 in connection with U.S. Appl. No. 12/432,973.

* cited by examiner

*Primary Examiner* — Zandra V. Smith
*Assistant Examiner* — Damian A Hillman
(74) *Attorney, Agent, or Firm* — Ladas & Parry LLP

(57) ABSTRACT

A flexible semiconductor package includes a flexible substrate. A data chip is disposed over the flexible substrate. The data chip includes a data storage unit for storing data and first bonding pads that are electrically connected to the data storage unit. A control chip is disposed over the flexible substrate. The control chip includes a data processing unit for processing the data in the data chip and second bonding pads that are electrically connected to the data processing unit. Wirings are formed in order to electrically connect the first bonding pads to the second bonding pads.

4 Claims, 4 Drawing Sheets

FLEXIBLE SEMICONDUCTOR PACKAGE AND METHOD FOR FABRICATING THE SAME

CROSS-REFERENCE TO RELATED APPLICATIONS

The present application claims priority to Korean patent application number 10-2008-0098753 filed on Oct. 8, 2008, which is incorporated herein by reference in its entirety.

BACKGROUND OF THE INVENTION

The present invention relates generally to semiconductor devices, and more particularly to a flexible semiconductor package and a method for fabricating the same.

Recent developments in semiconductor technology have resulted in semiconductor chips capable of both storing massive amounts of data and processing the data, and a semiconductor package including the semiconductor chip.

A typical semiconductor package includes a substrate, a semiconductor chip disposed on the substrate, a connection member for connecting the semiconductor chip and the substrate, and a molding member covering the semiconductor chip in order to protect the semiconductor chip from external impact. In order to provide sufficient protection from external impact, the molding member covering the semiconductor chip has high strength.

As the application of semiconductor packages has increased, efforts have been undertaken to develop a flexible semiconductor package capable of being deflected (e.g., curved or bent).

The flexible semiconductor package has a structure in which a semiconductor chip is mounted on a flexible substrate.

However, when a memory semiconductor chip is mounted on a flexible semiconductor package, the semiconductor chip of the flexible semiconductor package is frequently damaged.

The damage to the memory semiconductor chip mounted in a flexible semiconductor package is due to the memory semiconductor chip having a relatively large size when a data storing unit for storing data and a data processing unit for processing the data are disposed together in a single memory semiconductor chip. In general, in a flexible semiconductor package, when the size of the semiconductor chip is increased, the semiconductor chip is damaged more frequently when the substrate is deflected (i.e., curved or bent).

SUMMARY OF THE INVENTION

Embodiments of the present invention include a flexible semiconductor package capable of being deflected (e.g., curved or bent) as well as preventing damage to a semiconductor chip of the semiconductor package.

Also, embodiments of the present invention are directed to a method for fabricating the flexible semiconductor package.

In one aspect of the present invention, a flexible semiconductor package includes a flexible substrate; a data chip disposed over the flexible substrate and having a data storage unit for storing data and first bonding pads electrically connected with the data storage unit; a control chip disposed over the flexible substrate and having a data processing unit for processing the data in the data chip and second bonding pads electrically connected with the data processing unit; and wirings for electrically connecting the first bonding pads to the second bonding pads.

A plurality of the data chips may also be disposed in a matrix form over the flexible substrate.

The flexible semiconductor package may further include a first bump interposed between the first bonding pad and the wiring; and a second bump interposed between the second bonding pad and the wiring.

The wiring may include a first coupling recess for inserting the first bump therein to increase a contact area between the wiring and the first bump, and a second coupling recess for inserting the second bump therein to increase a contact area between the wiring and the second bump.

The flexible semiconductor package may further include a flexible protection member disposed over the flexible substrate to cover the data chip and the control chip and having an opening some portion of the wiring.

The flexible semiconductor package may further include a first stress absorption member interposed between the data chip and the flexible substrate; and a second stress absorption member interposed between the control chip and the flexible substrate.

In another aspect of the present invention, a method for fabricating a semiconductor package includes electrically connecting first bonding pads of a data chip having a data storage unit for storing data to wirings of a flexible substrate; electrically connecting second bonding pads of a control chip having a data processing unit for processing the data in the data chip to the wirings of the flexible substrate; and forming a flexible protection member for covering the data chip and the control chip over the flexible substrate.

At least two data chips may also be disposed in a matrix form over the flexible substrate.

The wiring and the first bonding pads may be electrically connected by a first bump, and the wiring and the second bonding pads may be electrically connected by a second bump.

The step of forming the protection member may also include a step of forming an opening for exposing some portion of the wiring.

The method may further include interposing a first stress absorption member between the data chip and the flexible substrate; and interposing a second stress absorption member between the control chip and the flexible substrate.

DESCRIPTION OF SPECIFIC EMBODIMENTS

Figure 1:
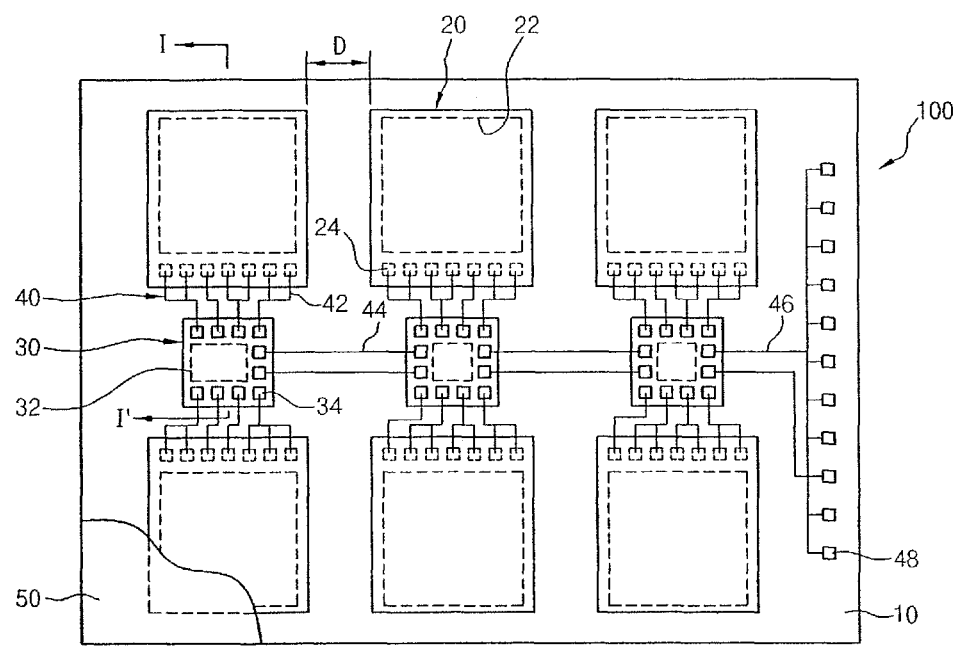
FIG. 1 is a plan view showing a flexible semiconductor package in accordance with an embodiment of the present invention.
Figure 2:
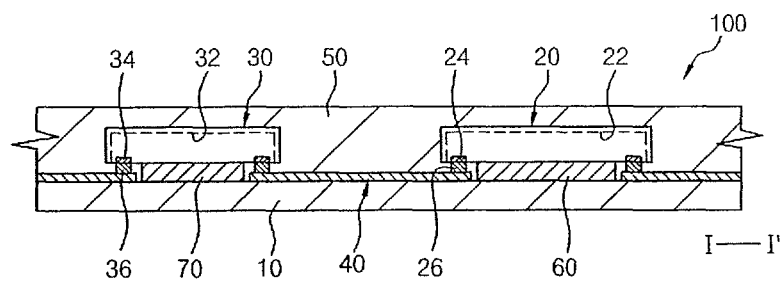
FIG. 2 is a cross-sectional view taken along line I-I' in FIG. 1.

FIG. 1 is a plan view showing a flexible semiconductor package in accordance with an embodiment of the present invention. FIG. 2 is a cross-sectional view taken along line I-I' in FIG. 1.

Referring to FIGS. 1 and 2, a flexible semiconductor package 100 includes a flexible substrate 10, a data chip 20, a control chip 30 and wirings 40. In addition, the flexible semiconductor package 100 further includes a protection member 50 and first and second stress absorption members 60, 70.

The flexible substrate 10 contains a flexible material. The flexible substrate 10 has, for example, a flexible film shape with a thin thickness.

The data chip 20 is disposed over the flexible substrate 10. In the present embodiment, a plurality of the data chips 20 is disposed over the flexible substrate 10, and the data chips are disposed in matrix form. The data chips 20 are spaced apart from each other by a distance D. In the present embodiment, the data chips 20 are disposed in a form of a 3×2 matrix over the flexible substrate 10.

The data chip 20 includes a data storage unit 22 for storing data and first bonding pads 24 electrically connected to the data storage unit 22. In the present embodiment, the first bonding pads 24 are disposed along an edge of the face of the data chip 20 facing the flexible substrate 10 (hereinafter referred to as the "upper face"). Alternatively, the first bonding pads 24 may be disposed along multiple edges (for example, opposing edges) of the upper face of the data chip 20.

While a data storage unit for storing data and a peripheral circuit unit having a peripheral circuit for inputting/outputting the data into/from the data storage unit are formed integrally with each other in a conventional memory semiconductor chip, the data chip 20 in accordance with the present embodiment includes the data storage unit 22 alone without a peripheral circuit unit. In the present embodiment, when the data chip 22 includes the data storage unit 22 alone without a peripheral circuit unit, the data chip 20 has a size much smaller than that of a conventional memory semiconductor chip.

In the present embodiment, it is impossible to input/output the data through the first bonding pads 24 with only the data chip 20.

The control chip 30 is disposed over the flexible substrate 10. The control chip 30 can be disposed, for example, on the same face of the flexible substrate 10 as the face over which the data chip 20 is formed (that is, the face of the flexible substrate that faces the upper face of data chip 20 as shown in FIG. 2). Alternatively, the control chip 30 can be disposed on the face of the flexible substrate 10 that opposes the face over which the data chip 20 is formed.

In an exemplary embodiment of the present invention, the control chip 30 can be disposed between the data chips 20. The number of the control chip can be at least one, and in the present embodiment shown in FIG. 1, the control chip 30 is disposed in 3×1 matrix form between the data chips 20.

Each control chip 30 includes a data processing unit 32 for controlling the data storage unit 22 of the data chip 20 to generate a control signal for inputting/outputting the data into/form the data chip 20, and second bonding pads 34 electrically connected to the data processing unit 32. In the present embodiment, the second bonding pads 34 can be disposed along an edge of an upper face of the control chip 30 which faces to the flexible substrate 10.

In the present embodiment, the respective control chips 30 do not include a data storage unit. Since the control chips 30 do not include the data storage unit, the respective control chips 30 has a very small size when compared to a conventional memory semiconductor chip having a data storage unit and a data processing unit together. In the present embodiment, each control chip 30 can have, for example, a size smaller than the size of the data chip 20.

Wirings 40 are disposed over the flexible substrate 10. The wirings 40 include a first wiring 42, a second wiring 44 and a third wiring 46.

A first end of the first wiring 42 is electrically connected to the first bonding pad 24 of the data chip 20 and a second end opposite to the first end is electrically connected to the second bonding pad 34 of the control chip 30.

A first end of the second wiring 44 is electrically connected to the second bonding pad 34 of the control chip 30 and a second end opposite to the first end is electrically connected to the second bonding pad 34 of the adjacent control chip 30.

A first end of the third wiring 46 is electrically connected to the second bonding pad 34 of the control chip 30 and a second end opposite to the first end is disposed over the flexible substrate 10. Pads 48 are disposed at the second end of the third wiring 46.

Referring to FIG. 2, the wiring 40 and the first bonding pad 24 of the data chip 20 can be electrically connected by a first bump 26. Also, the wiring 40 and the second bonding pad 34 of the control chip 30 can be electrically connected by a second bump 36.

In the present embodiment, when deflection is generated in the flexible substrate 10, a large shear stress is applied to the first bump 26 for connecting the first bonding pad 24 of the data chip 20 to the wiring 40, since less deflection is generated in the data chip 20 as compared to the flexible substrate 10. In the present embodiment, a first stress absorption member 60 is interposed between the flexible substrate 10 and the data chip 20 to reduce the shear stress applied to the first bump 26. The first stress absorption member 60 functions to reduce the shear stress applied to the first bump 26 as well as to firmly secure the data chip 20 to the flexible substrate 10.

Also, when the deflection is generated in the flexible substrate 10, a large shear stress is applied to the second bump 36 connecting the second bonding pad 34 of the control chip 30 to the wiring 40, since less deflection is generated in the control chip 30 as compared to the flexible substrate 10. In the present embodiment, a second stress absorption member 70 is interposed between the flexible substrate 10 and the control chip 30 to reduce the shear stress applied to the second bump 36. The second stress absorption member 70 functions to reduce the shear stress applied to the second bump 36 as well as to firmly secure the control chip 30 to the flexible substrate 10.

Meanwhile, in order to efficiently absorb the shear stress applied to the first bump 26, the wiring 40 connected to the first bump 26 can be formed with a recess or a hole for inserting the first bump 26 therein. When the first bump 26 is inserted in the recess or hole of the wiring 40, a contact area between the first bump 26 and the wiring 40 is increased to thereby prevent the first bump 26 from being separated from the wiring 40 by the shear stress.

Also, in order to efficiently absorb the shear stress applied to the second bump 36, the wiring 40 connected to the second bump 36 can be formed with a recess or a hole for inserting the second bump 36 therein. When the second bump 36 is inserted in the recess or hole of the wiring 40, a contact area between the second bump 36 and the wiring 40 is increased to thereby prevent the second bump 36 from being separated from the wiring 40 by the shear stress.

Referring to FIG. 2, a flexible protection member 50 can be disposed over the flexible substrate 10. The protection member 50 can be a flexible organic layer and the protection member 50 is formed with an opening for exposing the pads 48. The protection member 50 prevents the data chip 20 and/or the control chip 30 from being damaged by external impact and/or contaminated.

Figure 3:
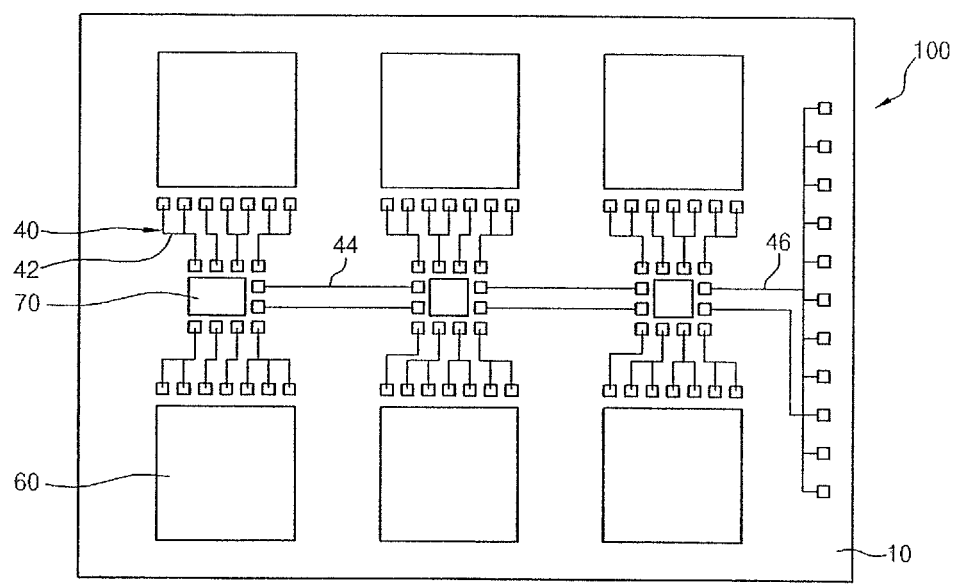
FIGS. 3 through 5 are plan views shown for illustrating a method for fabricating a semiconductor package in accordance with an embodiment of the present invention.
Figure 4:
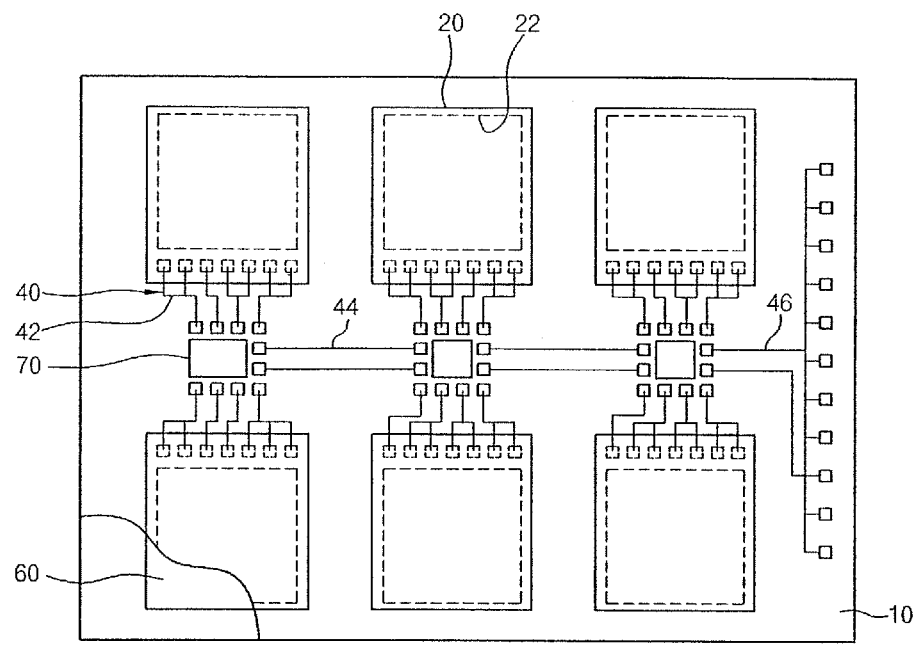
Figure 5:
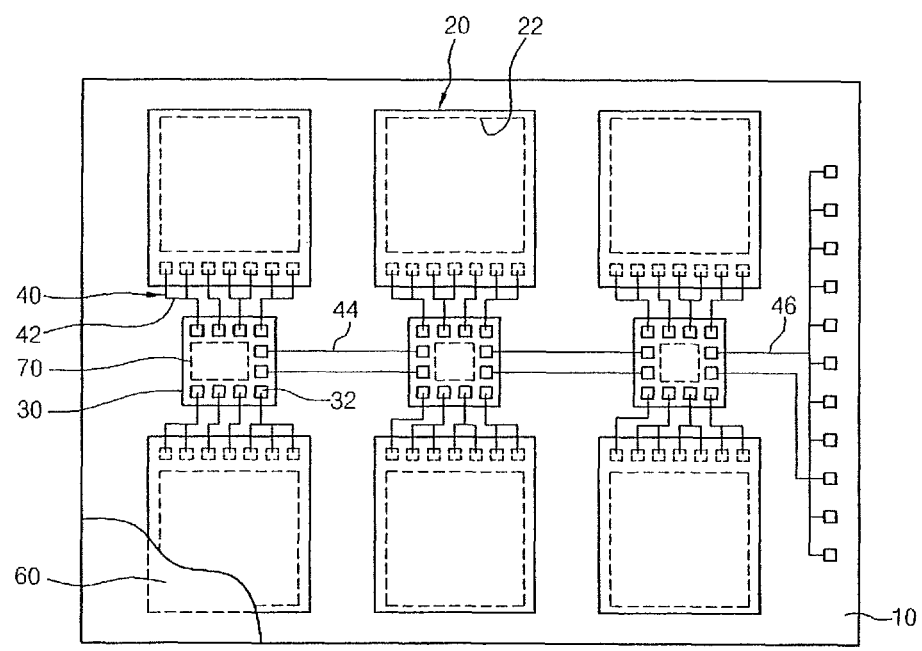

FIGS. 3 through 5 are plan views shown for illustrating a method for fabricating a semiconductor package in accordance with an embodiment of the present invention.

Referring to FIG. 3, in order to fabricate a flexible semiconductor package, a flexible substrate 10 is prepared.

The flexible substrate 10 has a flexible film shape and wirings 40 are formed over the upper face of the flexible substrate 10.

In order to form the wirings 40, a metal layer is formed over the flexible substrate 10 and the metal layer is patterned by a photolithography process. Therefore, the wirings 40 include a first wiring 42, a second wiring 44 and a third wiring 46 that are formed over the flexible substrate 10.

The first wiring 42 electrically connects a data chip to a control chip (which will be described later), the second wiring 44 electrically connects adjacent control chips 30, and a first end of the third wiring 46 is electrically connected to the control chip. Pads are formed at a second end of the third wiring 46 that is opposite to the first end.

A first stress absorption member 60 is disposed in a portion of the flexible substrate 10 where the data chip to be described later is to be attached, and a second stress absorption member 70 is disposed in a portion of the flexible substrate 10 where the control chip to be described later is to be attached. When deflection is generated in the flexible substrate having attached thereon the data chip and the control chip (described layer), the first and second stress absorption members 60, 70 absorb a bending stress or a shear stress applied to the data chip and the control chip so as to prevent damage of the data chip and the control chip as well as prevent separation of the control chip and the wiring and separation of the data chip and the wiring.

Referring to FIG. 4, after the flexible substrate 10 is prepared, the data chip 20 is attached onto the first stress absorption member 60 of the flexible substrate 10. The data chip 20 includes a data storage unit 22 for storing data, but the data chip 20 does not include a data processing unit for inputting/outputting the data contained in the data storage unit 22. Therefore, the data chip 20 has a relatively small size when compared to a conventional memory semiconductor chip having the data storage unit and the data processing unit together.

The data chip 20 includes first bonding pads 24 as shown in FIG. 2, and the first bonding pads 24 are electrically connected with the wiring 40, for example, via a first bump 26. Alternatively, the first bonding pads 24 of the data chip 20 may be electrically connected with the wiring 40 by an anisotropic conductive film.

Referring to FIG. 5, after the data chip 20 is electrically connected to the wiring 40 of the flexible substrate 10, the control chip 30 is attached onto the second stress absorption member 70 of the flexible substrate 10. The control chip 30 generates a control signal for inputting/outputting the data stored in the data storage unit 22 of the data chip 20. The control chip 30 does not include the data storage unit, and therefore the control chip 30 has a relatively small size when compared to a conventional memory semiconductor chip having the data storage unit and the data processing unit together.

The control chip 30 includes second bonding pads 34 as shown in FIG. 2, and the second bonding pads 34 are electrically connected to the wiring 40 via, for example, a second bump 36. Alternatively, the second bonding pads 34 of the control chip 30 may be electrically connected to the wiring 40 by an anisotropic conductive film.

In the present embodiment, when deflection is generated in the flexible substrate 10, a shear stress can be applied to the first bump 26 which can in turn cause the first bump 26 to be separated from the first bonding pad 24 or the wiring 40. In the present embodiment, the wiring 40 can be formed with a recess or a hole for inserting the first bump 26 therein to increase a contact area between the first bump 26 and the wiring 40.

Also, when the deflection is generated in the flexible substrate 10, a shear stress can be applied to the second bump 36, which can in turn cause the second bump 36 to be separated from the second bonding pad 34 or the wiring 40. In the present embodiment, the wiring 40 can be formed with a recess or a hole for inserting the second bump 36 therein to increase a contact area between the second bump 36 and the wiring 40.

Referring again to FIG. 2, a flexible protection member 50 is formed over the flexible substrate 10. The protection member 50 can be a flexible organic layer. The protection member 50 prevents the data chip 20 and the control chip 30 from being damaged by an external impact and/or vibration.

As is apparent from the above description, according to the present invention, it is possible to prevent damage of a semiconductor chip when disposing the semiconductor chip over a flexible substrate.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for fabricating a flexible semiconductor package, the method comprising the steps of:
    forming a wiring over a flexible substrate having a data chip and a control chip formed thereover;
    electrically connecting first bonding pads of the data chip to the wiring, wherein the data chip includes a data storage unit for storing data, wherein the wiring and the first bonding pad of the data chip are electrically connected by a first bump;
    electrically connecting second bonding pads of the control chip to the wiring, wherein the control chip includes a data processing unit for processing the data in the data chip, wherein the wiring and the second bonding pad of the control chip are electrically connected by a second bump; and
    forming a flexible protection member for covering the data chip and the control chip over the flexible substrate,
    wherein the wiring includes a first coupling recess and a second coupling recess, wherein the first bump is inserted in the first coupling recess to increase a contact area between the wiring and the first bump, and the second bump is inserted in the second coupling recess to increase a contact area between the wiring and the second bump.

2. The method according to claim 1, wherein at least two data chips are disposed in a matrix form over the flexible substrate.

3. The method according to claim 1, wherein the step of forming the protection member comprises a step of forming an opening for exposing a portion of the wiring.

4. The method according to claim 1, further comprising the steps of: interposing a first stress absorption member between the data chip and the flexible substrate; and interposing a second stress absorption member between the control chip and the flexible substrate.

* * * * *